United States Patent [19]
Fletcher

[11] 3,967,269
[45] June 29, 1976

[54] ANALOGUE TO DIGITAL CONVERTERS
[75] Inventor: Russell Edward Fletcher, Bracknell, England
[73] Assignee: British Broadcasting Corporation, London, England
[22] Filed: Apr. 29, 1974
[21] Appl. No.: 464,975

[52] U.S. Cl. .................. 340/347 AD; 340/347 CC
[51] Int. Cl.² ...................................... H03K 13/175
[58] Field of Search ............... 340/347 AD, 347 CC

[56] References Cited
UNITED STATES PATENTS

| | | | |
|---|---|---|---|
| 3,541,315 | 11/1970 | Naydan et al. | 235/154 |
| 3,544,779 | 12/1970 | Farrow | 235/155 |
| 3,573,796 | 5/1971 | Querishi | 340/347 |

*Primary Examiner*—Charles D. Miller
*Attorney, Agent, or Firm*—Robert F. O'Connell

[57] ABSTRACT

An analogue-to-digital converter of the parallel-series-parallel type has additional circuitry associated with the second quantization stage which accepts overflow caused by errors in the first quantization stage and generates a correction signal to correct the output of the first quantization stage.

3 Claims, 8 Drawing Figures

A   B

A   B

A   B

ANALOGUE TO DIGITAL CONVERTERS

This invention relates to analogue-to-digital converters of the so-called parallel-series-parallel type.

A converter of this type will be described with reference to the following figures of the drawings in which.

Figure 1:
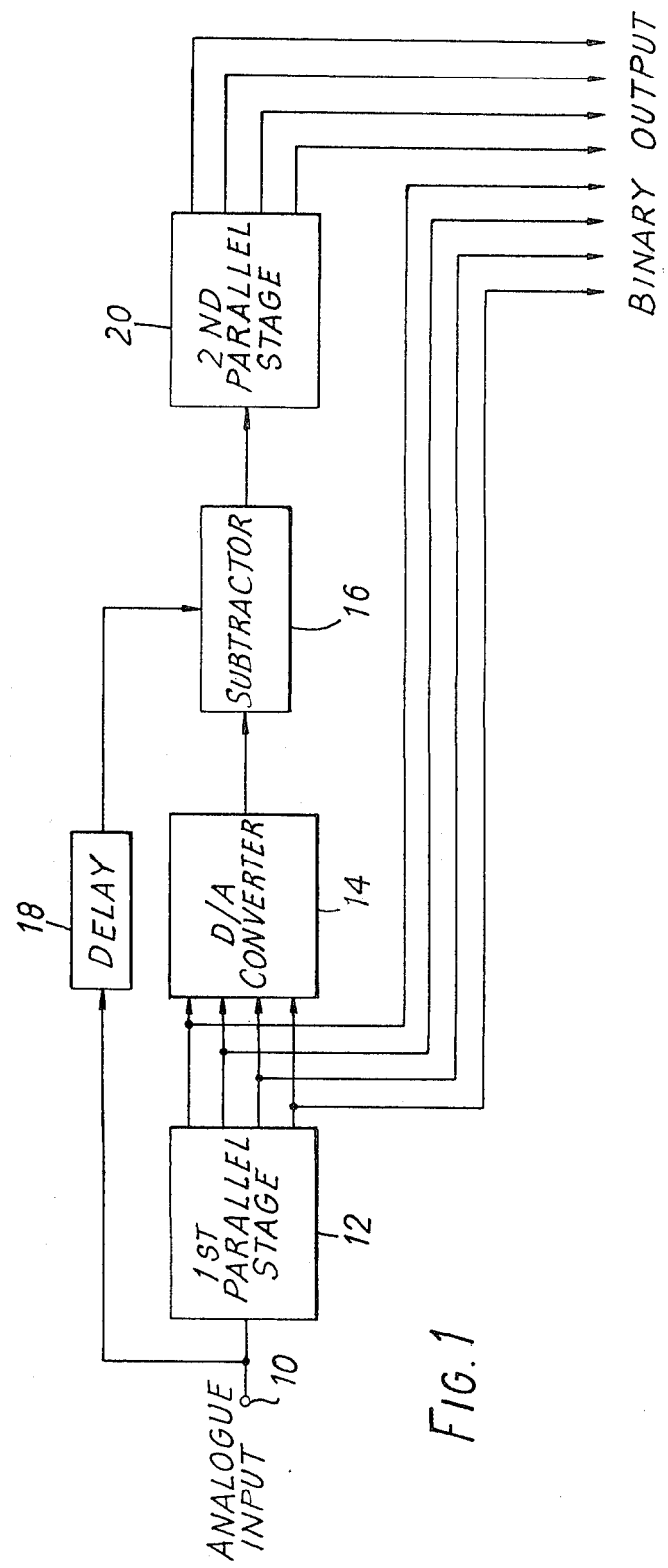
FIG. 1 is a block circuit diagram of a known parallel-series-parallel analogue-to-digital converter.

The electrical analogue-to-digital converter of FIG. 1 has an analogue input 10 connected to a first parallel stage 12. In this stage the input is compared with a number of coarse quantisation levels and an output is generated indicating which of a corresponding number of coarse quantisation ranges the input signal falls into. This output constitutes part of the output of the converter, and is also applied to a digital-to-analogue converter 14. This regenerates the coarse level associated with the coarse range into which the analogue input falls, and applies this coarse level to a subtractor 16.

The subtractor 16 also receives the analogue input signal through an optional delay 18 which is used to retime the input signal at the subtractor. The subtractor output is a measure of the amount by which the input signal differs from one of the coarse levels, and this is applied to a second parallel stage 20. This stage compares the difference signal with a number of fine quantisation levels and generates an output which indicates into which of a corresponding number of fine quantisation ranges the difference signal falls. The output of the second parallel stage 20 constitutes the rest of the output of the converter.

The converter can be used to convert analogue television signals into digital signals. The analogue signal is first sampled to produce a train of analogue samples which are applied to the input 10. Conveniently the digital output is in binary form, and currently eight binary bits are used for coding television signals, giving $2^8 = 256$ quantisation levels.

Figure 2A:
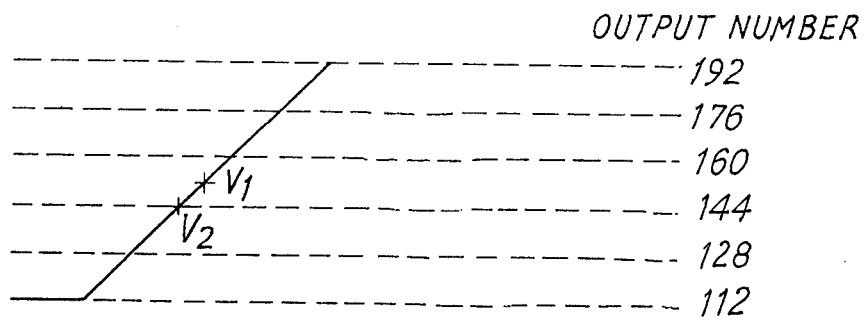
FIG. 2A illustrates an input signal in relation to the coarse levels of the converter.

Referring to FIG. 2A, an example of the operation of the converter of FIG. 1 will now be described. The 256 possible levels are split into 16 coarse levels, and the input signal is measured relative to these by the first parallel stage. If the signal has the value V1 shown in FIG. 2A, i.e. it lies between levels 144 and 160, the first parallel stage 12 will provide an output representative of level 144. This level is in fact coarse level 9 and the stage 12 generates the binary output 1001. As will be seen from FIG. 1 this constitutes the first four digits of the binary output of the converter.

The digital-to-analogue converter 14 also receives the input 1001 and regenerates an analogue output of level 144, equivalent to voltage V2 on FIG. 2A. The subtractor 16 thus receives the voltages V1 and V2 and forms the difference between them. This difference is applied to the second parallel stage 20 which generates a binary output representative of the amount by which the input voltage exceeds the coarse level next below it. This binary output constitutes the four least-significant digits of the converter output.

The 16 levels in the second parallel stage 20 are each one-sixteenth of the amplitude of those in the first stage 12. Thus, although the amplitude of the input signal has been found to one part in 256, only 32 (i.e. 2 × 16) measurement elements have been necessary to do this.

Figure 2B:
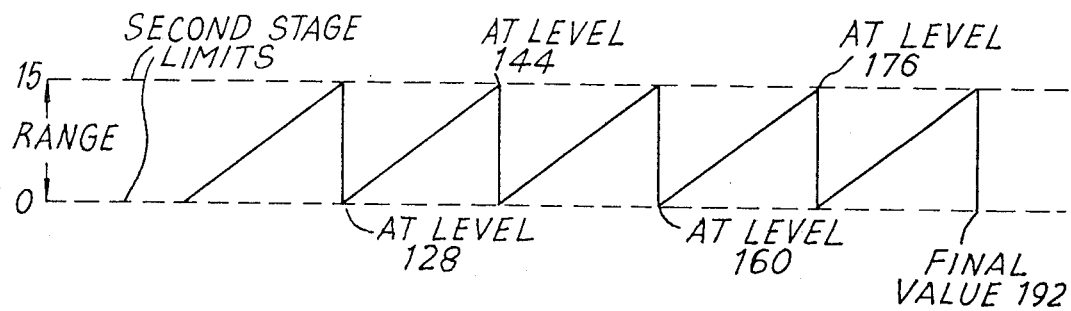
FIG. 2B illustrates the output of the subtractor in the converter for the input signal of FIG. 2A.

If a continuously increasing waveform of the type shown in FIG. 2A is applied to the input 10, the output of the subtractor 16 will take the form shown in FIG. 2B. The dashed lines show the extremities of the quantising range of the second parallel stage 20, corresponding to a range of 0 to 15 fine levels. At each coarse level the output of the subtractor 16 will change from level 15 to level 0, and will then increase steadily to 15 again at the next coarse level.

Figure 3:
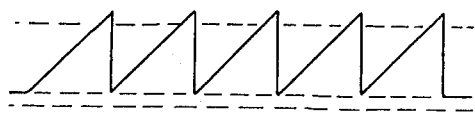
FIGS. 3, 4 and 5 show various types of error which can occur in the converter of FIG. 1, showing at A the output of the subtractor and at B the analogue equivalent of the digital output of the converter.
Figure 3:
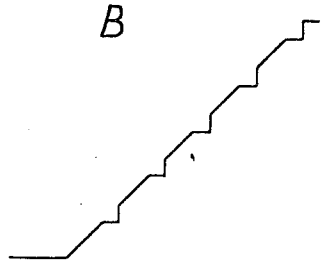

Three typical errors in the operation of the converter of FIG. 1 will now be described with reference to FIGS. 3, 4 and 5 respectively. FIG. 3 shows at A the output of the subtractor 16 when a d.c. offset has arisen. In the second parallel stage 20, an input of more than level 15 generates an output of 15, and an input of less than 0 generates an output of 0. Thus the steadily increasing count in the second parallel stage is interrupted, causing distortion of the transfer characteristic as shown at B. Codes which are represented by the subtractor output being above level 15 are missing in the output, producing a highly objectional pattern.

Figure 4:
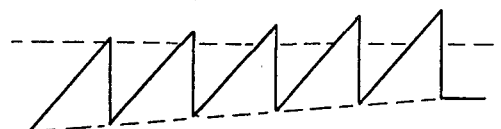
Figure 4:
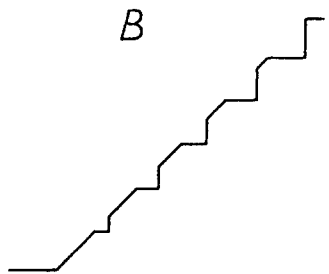
Figure 5:
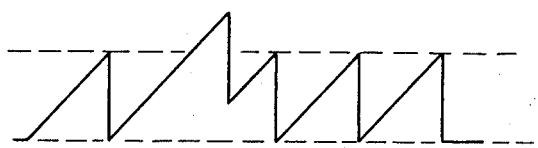
Figure 5:
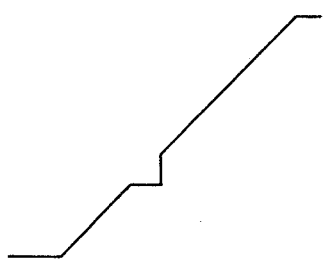

FIG. 4 shows the type of error which results from gain errors in the digital-to-analogue converter 14 or the delay line 18. The subtractor output might then take the form shown at A. The resulting converter output is indicated at B, and arises as described with reference to FIG. 3, but in this instance the distortion increases with increasing signal amplitude.

From FIG. 2B it can be seen that the vertical transitions on the subtractor output are caused by the first parallel stage 12 registering that the input signal is passing one of the coarse levels. If the component responsible for this operation is faulty and in fact reaches a decision well after the level has been passed, the subtractor output will be as shown at A in FIG. 5. Here it is assumed that the fact that the input signal has passed level 144 is not detected until it in fact reaches level 150. This produces a single non-linearity in the output signal as shown at B. This type of error can occur randomly throughout the transfer characteristic.

These three errors can be directly additive, and if the total error is to be maintained at not greater than ±½ of the increment between fine levels, the stability requirement for each type of error in the example described is about ±0.07%. This requires expensive components and is not easy to achieve over a range of temperatures.

FIG. 1 thus illustrates one analogue-to-digital converter of the type comprising first digitising means for relating the analogue input signal to one of a number of coarse amplitude ranges and for providing a digital output indicative of the coarse range into which the input signal falls, subtractive means for determining the difference between the analogue input signal and the coarse level corresponding to the said range into which the input signal falls, and second digitising means for providing a digital output indicative of the said difference.

According to this invention a converter of such a type further comprises means for detecting whenever the output of the subtractive means exceeds a range defined by the said coarse range and for generating a correction signal in response thereto. Conveniently the detecting means is connected to the second digitising means.

In a preferred arrangement, when the detecting means provides an output, it is applied to modify the output of the first digitising means, and the second digitising means provides an output indicative of the difference between the analogue input signal and a coarse level adjacent to that indicated by the first digitising means.

Alternatively, the correction signal can be applied to modify the combined outputs of the first and second digitising means.

Figure 7:
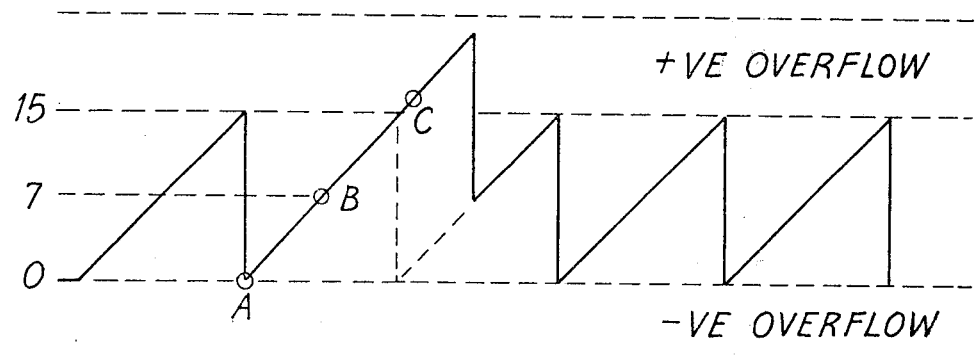
Figure 6:
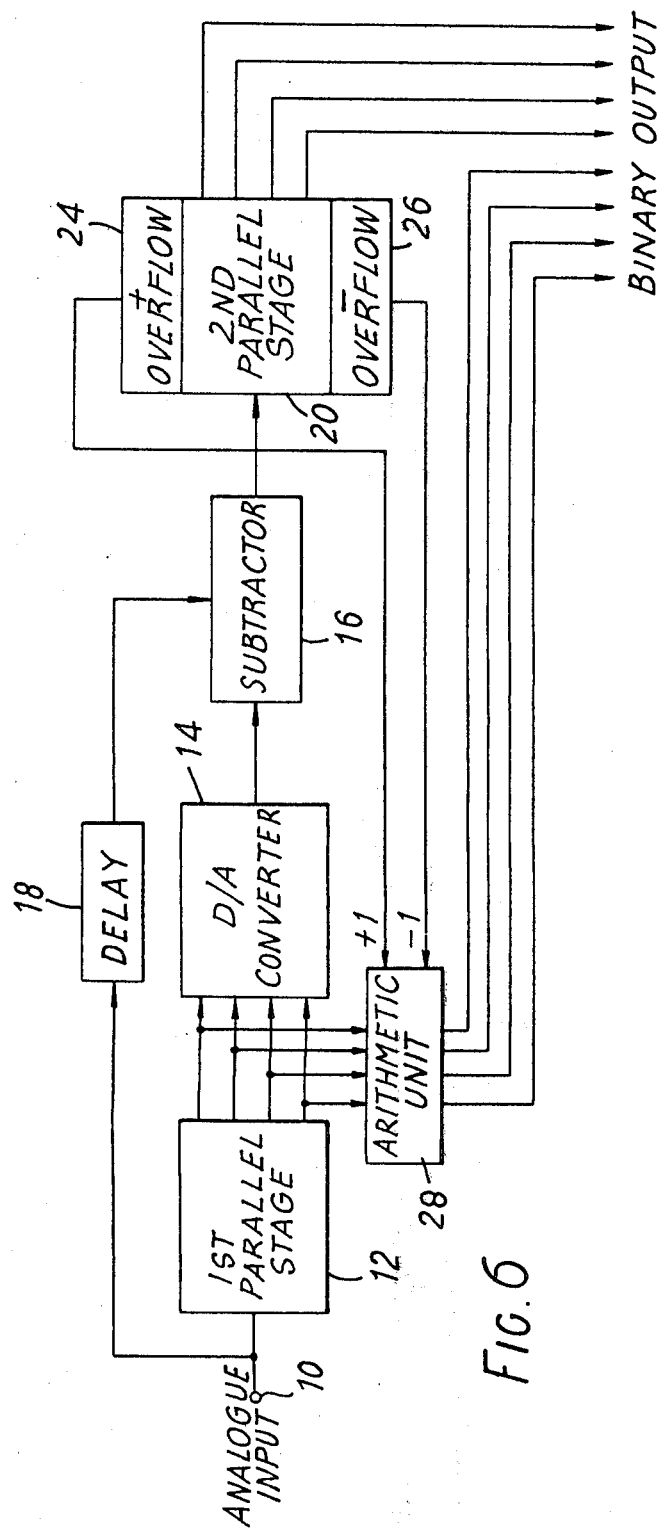

The invention will be further described, by way of example, with reference to the remaining figures of the drawings of which:

FIG. 6 is a circuit diagram of an analogue-to-digital converter of the type shown in FIG. 1 modified in accordance with the invention; and FIG. 7 is a waveform diagram illustrating the operation of the modified converter.

Much of the converter of FIG. 6 is identical to that of FIG. 1 and will not be described again in detail. Corresponding parts bear the same reference numerals. Referring to FIG. 6, it will be seen that the second parallel stage 20 has been provided with two overflow detectors, namely the positive overflow detector 24 and the negative overflow detector 26. The positive overflow detector 24 detects whenever the output from the subtractor is above level 15 and the negative overflow detector 26 detects whenever the output from the subtractor is below level 0. The respective outputs from the overflow detectors are applied to respective inputs of an arithmetic unit 28 which is connected to the output of the first parallel stage 12.

The second parallel stage 20 also receives signals from the overflow detectors and is thereby modified to produce a "fold-back" action. That is to say, if a positive overflow is detected, the number generated at the output of the second parallel stage will be equal to the value actually received minus the largest number of increments the stage 20 can detect. Thus if the output of the subtractor 16 corresponds to number 20, the output of the second parallel stage is 20 − 16 = 4. Similarly, if a negative overflow is detected, a number equal to the largest number of increments which can be detected is added to the content of the second parallel stage, so that if the latter is 5 increments below zero, the output of the stage 20 is 16 + (−5) = 11.

The combination of these measures is effective to overcome errors in the circuit components prior to the subtractor 16. Referring to FIG. 7 there is shown in full lines the subtractor output with an error in the first parallel stage 12, such as described above with reference to FIG. 5. At point A on FIG. 7, the first parallel stage has registered level 128 and the output of the subtractor, and hence of the second parallel stage, is zero. The total output of the converter is thus 128 + 0 = 128. At point B the output will be 128 from the first parallel stage 12 and 7 from the second parallel stage totalling 135, as for the converter of FIG. 1.

However at point C the output of the subtractor represents number 18 and the converter then operates as follows. The positive overflow detector 24 directs the second parallel stage 20 to deduct 16 from its output code, so that the stage 20 provides an output representing 18 − 16 = 2. This is illustrated in dashed lines on FIG. 7. At the same time the arithmetic unit will add a one to the output of the first parallel stage 12. This one however numerically represents 16, and the output of the arithmetic unit is thus now 128 + 16 = 144. The total output is 144 + 2 = 146 and this is the same as that which would have resulted had there been no error and no overflow.

By detecting the errors as they enter the last stage in the converter, their total effect may be measured and this information used to correct the output. Other ways of correcting the output could be used, for example the overflow information could be used directly to correct the whole eight-bit converter output arithmetically. The system illustrated reduces the hitherto critical accuracy required of the first parallel stage, permitting greater accuracy and/or lower manufacturing cost. Furthermore temperature drift can be tolerated without non-linear distortion resulting.

I claim:
1. An analogue-to-digital converter comprising:
   first digitising means for relating an analogue input signal to one of a plurality of coarse amplitude ranges and providing a digital output indicative of the coarse range into which said input signal falls;
   subtractive means for determining the difference between said analogue input signal and the coarse level corresponding to said coarse range into which said input signal falls and providing an output in response thereto;
   second digitising means for providing a digital output indicative of said difference;
   means for detecting whenever said output of said subtractive means exceeds a range defined by said coarse range and for generating a digital correction signal in response thereto; and
   means for digitally adding said digital correction signal to said output of said first digitising means, and for modifying said output of said second digitising means to provide a digital output indicative of the difference between said analogue input signal and a coarse level adjacent to that indicated by said first digitising means.

2. A converter according to claim 1, wherein the input of said detecting means is connected to said second digitising means.

3. A converter according to claim 1, wherein said subtractive means comprises a digital-to-analogue converter connected to receive the digital output of said first digitising means and an analogue subtractor connected to receive the output of said digital-to-analogue converter and said analogue input signal.

* * * * *